United States Patent
Zheng et al.

(10) Patent No.: US 10,418,408 B1
(45) Date of Patent: Sep. 17, 2019

(54) CURVED IMAGE SENSOR USING THERMAL PLASTIC SUBSTRATE MATERIAL

(71) Applicant: OmniVision Technologies, Inc., Santa Clara, CA (US)

(72) Inventors: Yuanwei Zheng, San Jose, CA (US); Chia-Chun Miao, Sunnyvale, CA (US); Gang Chen, San Jose, CA (US); Yin Qian, Milpitas, CA (US); Duli Mao, Sunnyvale, CA (US); Dyson H. Tai, San Jose, CA (US); Lindsay Grant, Los Gatos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/016,057

(22) Filed: Jun. 22, 2018

(51) Int. Cl.
  *H01L 27/146* (2006.01)
  *H04N 5/378* (2011.01)

(52) U.S. Cl.
  CPC .. *H01L 27/14643* (2013.01); *H01L 27/14621* (2013.01); *H01L 27/14627* (2013.01); *H01L 27/14685* (2013.01); *H01L 27/14687* (2013.01); *H04N 5/378* (2013.01)

(58) Field of Classification Search
  CPC ......... H01L 27/14621; H01L 27/14627; H01L 27/14643; H01L 27/14685; H01L 27/14687
  See application file for complete search history.

(56) References Cited

U.S. PATENT DOCUMENTS

| | | | |
|---|---|---|---|
| 3,784,440 | A | 1/1974 | Grunwald et al. |
| 4,814,295 | A | 3/1989 | Mehta |
| 5,608,267 | A | 3/1997 | Mahulikar et al. |
| 5,693,956 | A | 12/1997 | Shi et al. |
| 5,894,108 | A | 4/1999 | Mostafazadeh et al. |
| 6,541,832 | B2 | 4/2003 | Coyle |
| 7,968,923 | B2 | 6/2011 | Nagaraja et al. |
| 8,232,132 | B2 | 7/2012 | Nagaraja et al. |
| 8,450,821 | B2 | 5/2013 | Lake et al. |
| 8,772,069 | B2 | 7/2014 | Lake et al. |
| 9,349,763 | B1 | 5/2016 | Lin et al. |
| 2005/0030408 | A1* | 2/2005 | Ito ................. H04N 5/2253 348/340 |
| 2008/0136956 | A1 | 6/2008 | Morris et al. |
| 2008/0151089 | A1* | 6/2008 | Street ............ H01L 27/14601 348/308 |
| 2009/0115875 | A1* | 5/2009 | Choi ............. H01L 27/14618 348/294 |

(Continued)

OTHER PUBLICATIONS

U.S. Appl. No. 14/974,362, Curved Image Sensor, filed Dec. 18, 2015, 21 pages.

*Primary Examiner* — Peniel M Gumedzoe
(74) *Attorney, Agent, or Firm* — Christensen O'Connor Johnson Kindness PLLC

(57) ABSTRACT

An image sensor includes a plurality of photodiodes arranged in an array and disposed in a semiconductor material to receive light through a first surface of the semiconductor material. At least part of the semiconductor material is curved. A carrier wafer is attached to a second surface, opposite the first surface, of the semiconductor material, and a polymer layer is attached to the carrier wafer, so that the carrier wafer is disposed between the polymer layer and the semiconductor material.

16 Claims, 5 Drawing Sheets

(56) References Cited

U.S. PATENT DOCUMENTS

| | | |
|---|---|---|
| 2010/0038523 A1 | 2/2010 | Venezia et al. |
| 2010/0244165 A1 | 9/2010 | Lake |
| 2010/0320391 A1* | 12/2010 | Antonuk ............ H01L 27/1462 250/366 |
| 2010/0327389 A1 | 12/2010 | McCarten et al. |
| 2010/0330728 A1 | 12/2010 | McCarten et al. |
| 2011/0057277 A1 | 3/2011 | Yu |
| 2011/0217807 A1 | 9/2011 | Nagaraja et al. |
| 2012/0080765 A1 | 4/2012 | Ku et al. |
| 2012/0147207 A1 | 6/2012 | Itonaga |
| 2013/0237002 A1 | 9/2013 | Lake |
| 2013/0256822 A1 | 10/2013 | Chen et al. |
| 2015/0014802 A1 | 1/2015 | Cheng et al. |
| 2015/0334324 A1* | 11/2015 | Hashimoto ............ H04N 5/374 257/432 |
| 2015/0372033 A1 | 12/2015 | Cheng et al. |
| 2016/0126272 A1 | 5/2016 | Kim |
| 2016/0172393 A1 | 6/2016 | Kim |
| 2016/0307940 A1 | 10/2016 | Cheng et al. |
| 2016/0307942 A1 | 10/2016 | Cheng et al. |
| 2016/0307943 A1 | 10/2016 | Cheng et al. |

* cited by examiner

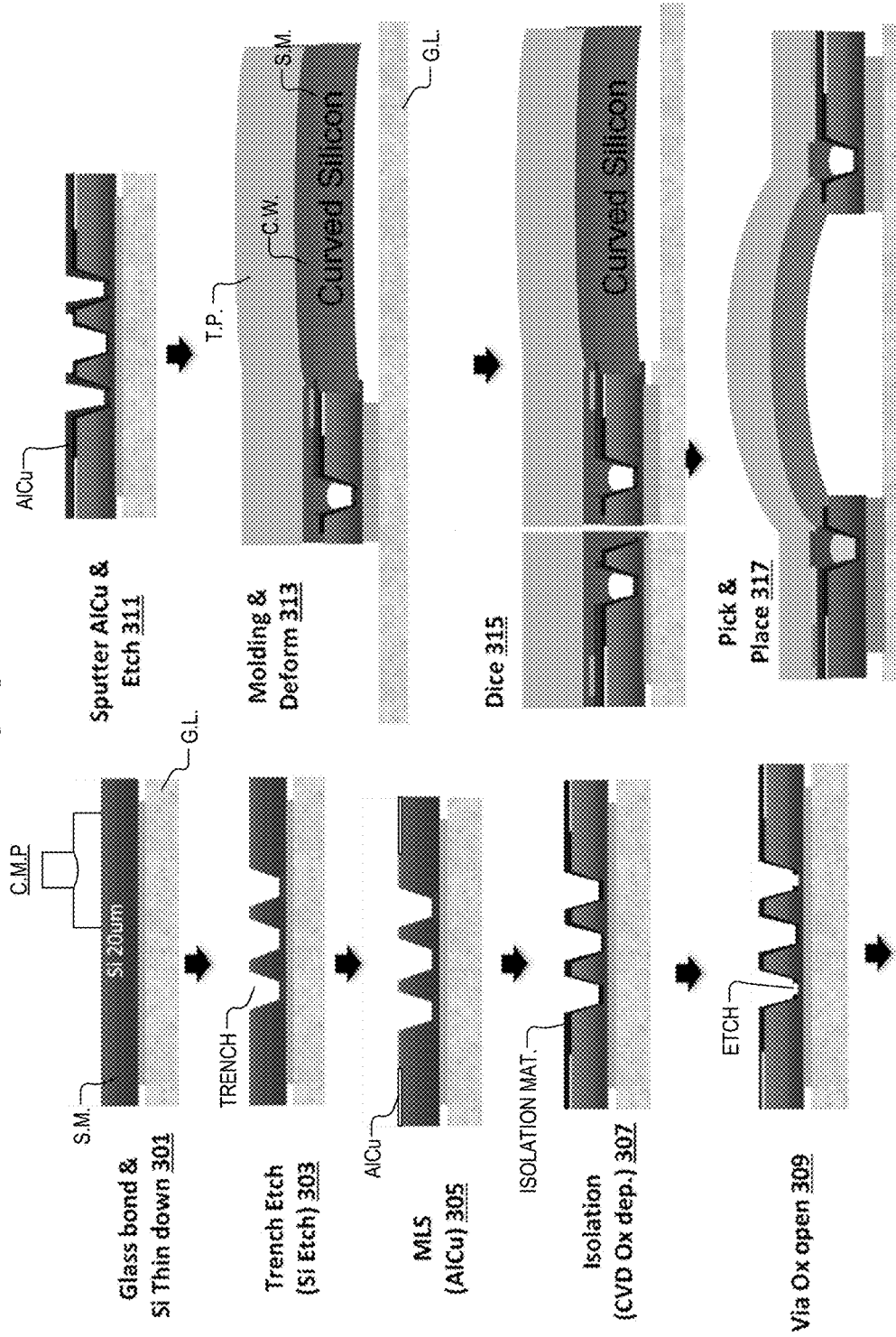

CURVED IMAGE SENSOR USING THERMAL PLASTIC SUBSTRATE MATERIAL

TECHNICAL FIELD

This disclosure relates generally to image sensor fabrication, and in particular but not exclusively, relates to curved image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices. While advances in pixel design have dramatically improved image sensor performance, several optical limitations have proved difficult to overcome by optimizing pixel circuitry alone.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIG. 3 illustrates part of a method to fabricate and curve the image sensor of FIG. 1, in accordance with an example of the present disclosure.

Figure 1:
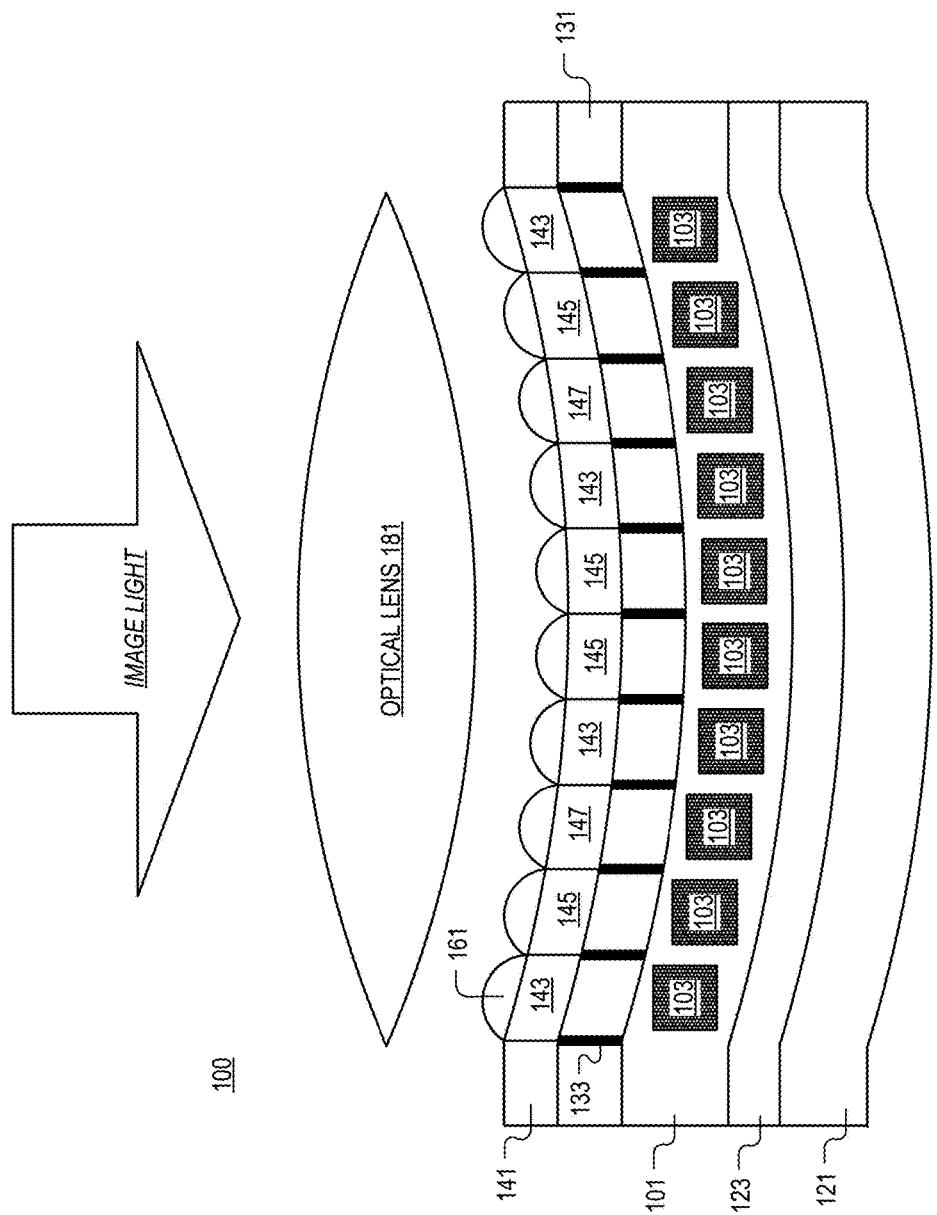
FIG. 1 illustrates a curved image sensor, in accordance with an example of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for a curved image sensor with polymer mounting are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Flat image sensors may not have the optimal shape for image capture. When a lens is disposed in front of a camera to focus image light, the lens focal plane may be curved, but the image sensor is flat. This may result in blurring around the edges of the images because the light is out of focus. The curved sensor concept may fundamentally change the way light reaches the edge of a pixel array in a CMOS or other type of image sensor array. By bending the sensor, the image quality at the edges may be comparable to the image quality at the center in terms of brightness, sharpness, conformability, and angle response. Additionally, with a curved image sensor (which may be frontside or backside illuminated) the quantum efficiency of green and blue pixels may be improved.

Generally, examples of the apparatus, systems, and methods described herein may have the following features in common. The imaging wafer (e.g., the wafer with the photodiodes) and carrier wafer are thinned down to 5 μm-20 μm, and then bonded to a thermal plastic substrate. In some examples, the two wafers are thinned to this thickness range in order for them to adequately bend without breaking, otherwise the wafers could crack when they are bent. The thermal plastic substrate is deformed at a relatively high temperature (for a polymer) and the curved surface remains post cooling. The imaging wafer, carrier wafer, and thermoplastic substrate are bonded on a mold with a plurality of curved surface regions, which are aligned with the individual dies. Each die on the imaging wafer is aligned with each curved surface region on the mold surface. The whole structure (including the mold) is heated to a high temperature, the thermal plastic material is deformed to follow the curved surface of the mold. Since the thermal plastic material is bonded with the imaging wafer and the carrier wafer, the imaging wafer and the carrier wafer will be deformed with the thermoplastic. As illustrated in the following figures, each die will be aligned and follow the curved surface region on the surface of the mold. As will be shown, it is possible to process both the whole image sensor and chip packaging before the imaging wafer and carrier wafer are bonded with the thermal plastic substrate. It is appreciated that bonding the thermoplastic to the carrier wafer could be aided with self-assembly (e.g., silane based monolayers) or other surface coatings.

The following disclosure describes the examples discussed above, and other examples, as they relate to the figures.

FIG. 1 illustrates a curved image sensor, in accordance with an example of the present disclosure. In the depicted example, curved image sensor 100 includes: semiconductor material 101, plurality of photodiodes 103, polymer layer 121 (e.g., a thermoplastic), carrier wafer 123, optical grid layer 131 (with optical grid 133), color filter layer 141 (with red color filters 143, green color filters 145, and blue color filters 147—which may be arranged into a Bayer pattern, EXR pattern, X-trans pattern, or the like), microlens layer 161, and optical lens 181. As shown in the example illustration, plurality of photodiodes 103 is disposed in semiconductor material 101 which has a concave surface facing the image light. In some examples, pinning wells (which may include doped semiconductor material, metal/semiconductor oxide, metal/semiconductor nitride, polymer or the like) may be disposed between individual photodiodes 103 to electrically isolate individual photodiodes 103. Color filter layer 141 is disposed between microlens layer 161 and semiconductor material 101 and is also concave. Color filter layer 141 and microlens layer 161 are optically aligned with plurality of photodiodes 103 to direct incident light into plurality of photodiodes 103. In the depicted example, color filter layer 141, optical grid layer 131, and microlens layer 161 are conformal with the concave cross-sectional profile of semiconductor material 101. This may help minimize optical defects on the edge of curved image sensor 100. Optical grid layer 131 is disposed between color filter layer 141 and semiconductor material 101, and optical grid layer 131 is optically aligned with plurality of photodiodes 103 such that optical grid layer 131 directs light into plurality of photodiodes 103 via an internal reflection process. In one example, optical grid 133 may include a metal mesh. In another example, optical grid 133 may include metal, oxide, or semiconductor structure fabricated through processing techniques such as thermal evaporation, chemical vapor deposition, or the like.

In one example, plurality of photodiodes 103 is arranged into an array including rows and columns (see infra FIG. 4) and the vertex of the concave cross-sectional profile of semiconductor material 101 is located at a center of the array of plurality of photodiodes 103. In the depicted example, optical lens 181 is disposed between a source of image light and semiconductor material 101, and optical lens 181 is positioned to direct image light into semiconductor material 101. To optimize device performance, in one example, a radius of curvature of the concave cross-sectional profile of semiconductor material 101 approximates a radius of curvature of optical lens 181. In one example, a shutter may be disposed between image light and curved image sensor 100 to block image light from reaching curved image sensor 100 between frames or during calibration measurements.

As will be described in greater detail later, polymer layer 121 may be bonded to the back of carrier wafer 123 (which is bonded to semiconductor material 101) in order to bend both carrier wafer 123 and semiconductor material 101 into the concave shape. Polymer layer 121 may span the width of photodiode 103 array to fully adhere to the wafer stack and promote bending.

In operation, plurality of photodiodes 103 will absorb image light to generate image charge. Image light is focused onto semiconductor material 101 (and corresponding optical structures, e.g., microlens layer 161, color filter layer 141, and optical grid layer 131) via optical lens 181. In conventional image sensors, the lens focal plane is curved but the semiconductor device stack is flat, resulting in image sensor edges that are blurred because they are out of focus (nonconforming with the curvature of the lens). Here, curved image sensor 100 may receive focused image light from optical lens 181 along the edges of curved image sensor 100 because the curvature of curved image sensor 100 now approximates that of a surface of optical lens 181. Image light received along the edges of curved image sensor 100 may then be efficiently passed through microlens layer 161 and color filter layer 141 into plurality of photodiodes 103. It is appreciated that image sensor 100 may be frontside (e.g., the side of the image sensor with circuitry) illuminated, or backside (e.g., the side of the image sensor with less circuitry) illuminated.

Figure 2A:
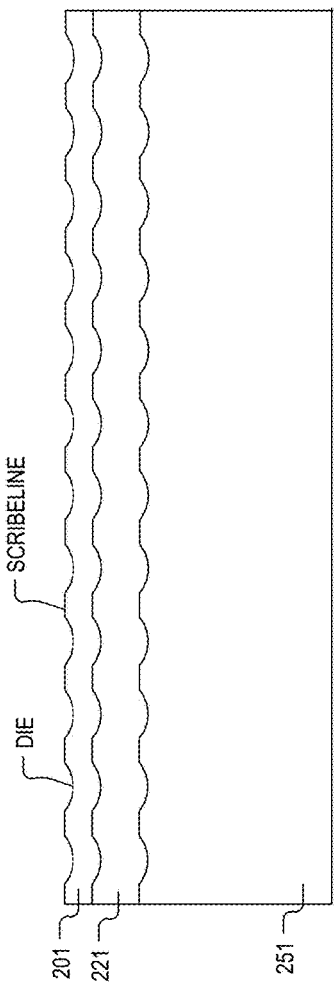
FIGS. 2A-2B illustrate part of a method to fabricate and curve the image sensor of FIG. 1, in accordance with an example of the present disclosure.
Figure 2B:
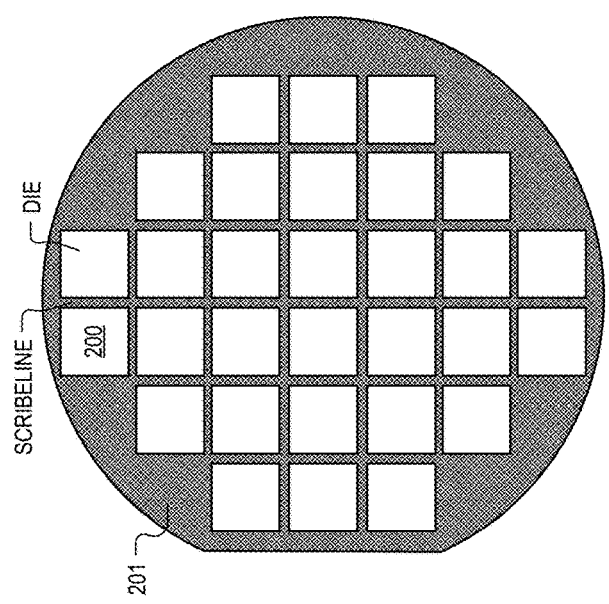

FIGS. 2A-2B illustrate part of a method to fabricate and curve the image sensor of FIG. 1, in accordance with an example of the present disclosure. Depicted in FIG. 2A are semiconductor material 201 (including a carrier wafer bonded to the semiconductor material 201), polymer layer 221, and mold 251. One of skill in the art will appreciate that at this stage in the manufacturing process, semiconductor material may already include architectures in FIG. 1 such as the photodiodes, optical grid layer, color filter layer, and microlens layer, in addition to elements of control circuitry and readout circuitry (which will be discussed elsewhere). However, these elements, and others, have been removed from FIG. 2A for simplicity of illustration.

In FIG. 2A, the polymer layer 221 (and accordingly semiconductor material 201) have been placed onto a scalloped (e.g., a mold with curved—not flat—indentations) mold 251. In some examples, mold 251 may be made from metal or ceramic. As stated, at this point in the manufacturing process, the photodiodes may have already been formed into arrays in semiconductor material 201 and the arrays are aligned with the curved portions of mold 251, while the periphery of each image sensor is aligned on the flat portions of mold 251. These flat portions define the scribeline area for separating the image sensors on the carrier wafer from one another. Mold 251, semiconductor material 201, carrier wafer, and polymer layer 221 (and in some examples other pieces of device architecture depicted in FIG. 1) are heated to a temperature range of 160-240° C. (more specifically approximately 200° C. depending on the type of the polymer). And in some examples, this temperature range includes a glass transition temperature or a melting temperature of polymer layer 221. Accordingly, the softened polymer layer 221 (which may include poly(methyl methacrylate), polycarbonate, or the like) changes shape to be substantially conformal to the surface of the mold 251. This causes semiconductor material 201 to bend into the concave portions of mold 251. As described above, this bending of semiconductor material 201 may be facilitating by chemical mechanically polishing semiconductor material 201 (including the carrier wafer) to be 5 μm-20 μm in thickness (down from 750 μm or more). Once returned to room temperature, semiconductor material 201, carrier wafer, polymer layer 221, micro lens layer, color filter layer, and optical grid layer may all be permanently deformed to be curved (i.e., not flat).

FIG. 2B shows a top down view of semiconductor material 201 (e.g., a full un-diced wafer) in the mold. As shown, each square represents an individual image sensor 200. And after being placed in the mold, each image sensor 200 is bent to create a curved sensor, in accordance with the teachings of the present disclosure. As will be shown later, each of these image sensors 200 may be separated from one another via dicing (e.g., mechanical or laser dicing).

FIG. 3 illustrates part of method 300 to fabricate and curve the image sensor of FIG. 1, in accordance with an example of the present disclosure. One of ordinary skill in the art will appreciate that diagrams 301-317 may occur in any order, and even in parallel, and that steps and features may have been omitted for simplicity of illustration. Moreover, additional diagrams/steps may be added to or removed from method 300 in accordance with the teachings of the present disclosure.

Diagram 301 shows a scribeline portion of the device, after having already formed plurality of photodiodes (and other device architectures shown in FIG. 1) in the semiconductor material ("S.M."). Depicted is bonding the scribeline portions of the semiconductor material to glass layer ("G.L."), and thinning the semiconductor material (and carrier wafer) to a combined thickness of 5 µm-20 µm via chemical mechanical polishing (see polishing wheel depicted). The photodiodes are disposed to receive light through a first surface (near the glass) of the semiconductor material but are out of the image frame in diagram 301, since only the scribeline region is depicted. In some examples, by optimizing the equipment, wheels, and grinding conditions, 5 µm thin wafers can be achieved.

Diagram 303 illustrates etching a portion of the semiconductor material in the scribeline region to form trenches. Trenches may be used to form vias to contact circuitry or the like.

Diagram 305 shows metal layer sputtering (MLS) on the surface of part of the semiconductor material. This may be used to form the various metal layers employed in image sensors (contacts, interconnects, etc.).

Diagram 307 shows depositing or forming isolation materials (e.g., silicon oxide, hafnium oxide or the like) to isolate portions of the image sensor. As shown, the materials may line trenches formed in the scribeline region.

Diagram 309 illustrates opening a via to an electrical contact, which, in some examples, may be performed by etching the deposited oxide material from diagram 307. Etching may be performed with either a wet or dry etch.

Diagram 311 shows sputter coating AlCu (or another metal or conductor) in the trenches and the via to make electrical connections to the contacts that were exposed in the etching step in diagram 309. Thus, diagram 311 shows forming at least a portion of control circuitry or a portion of readout circuitry in the semiconductor material prior to deforming the semiconductor material.

Diagram 313 shows attaching a second side of the semiconductor material ("S.M.") to a carrier wafer ("C.W."). Also shown is forming the polymer layer (e.g., thermoplastic "T.P.") so that the carrier wafer is disposed between the semiconductor material and the polymer layer. Diagram 313 also shows deforming the polymer layer, carrier wafer, and semiconductor material using the technique shown in FIG. 2A, so that the semiconductor material is, at least in part, curved.

Although depicted elsewhere (see e.g., FIG. 1), at this stage of fabrication, a microlens layer may have already been formed before deforming the semiconductor material, along with a color filter layer disposed between the semiconductor material and the microlens layer. Similarly, an optical grid layer may have been formed before deforming the semiconductor material, where the optical grid layer is disposed between the color filter layer and the semiconductor material. In some examples, deforming the semiconductor material includes deforming the microlens layer, the color filter layer, and the optical grid layer, so that the microlens layer, the color filter layer, and the optical grid layer are, at least in part, curved (see e.g., FIG. 1).

Diagram 315 shows separating, via dicing, the image sensor from other image sensors disposed on the carrier wafer after deforming the semiconductor material. This may achieved with a laser dicer or a mechanical (e.g., blade-based) dicer.

Diagram 317 shows picking the individual curved image sensors and placing them in image sensor packaging for final assembly.

Figure 4:
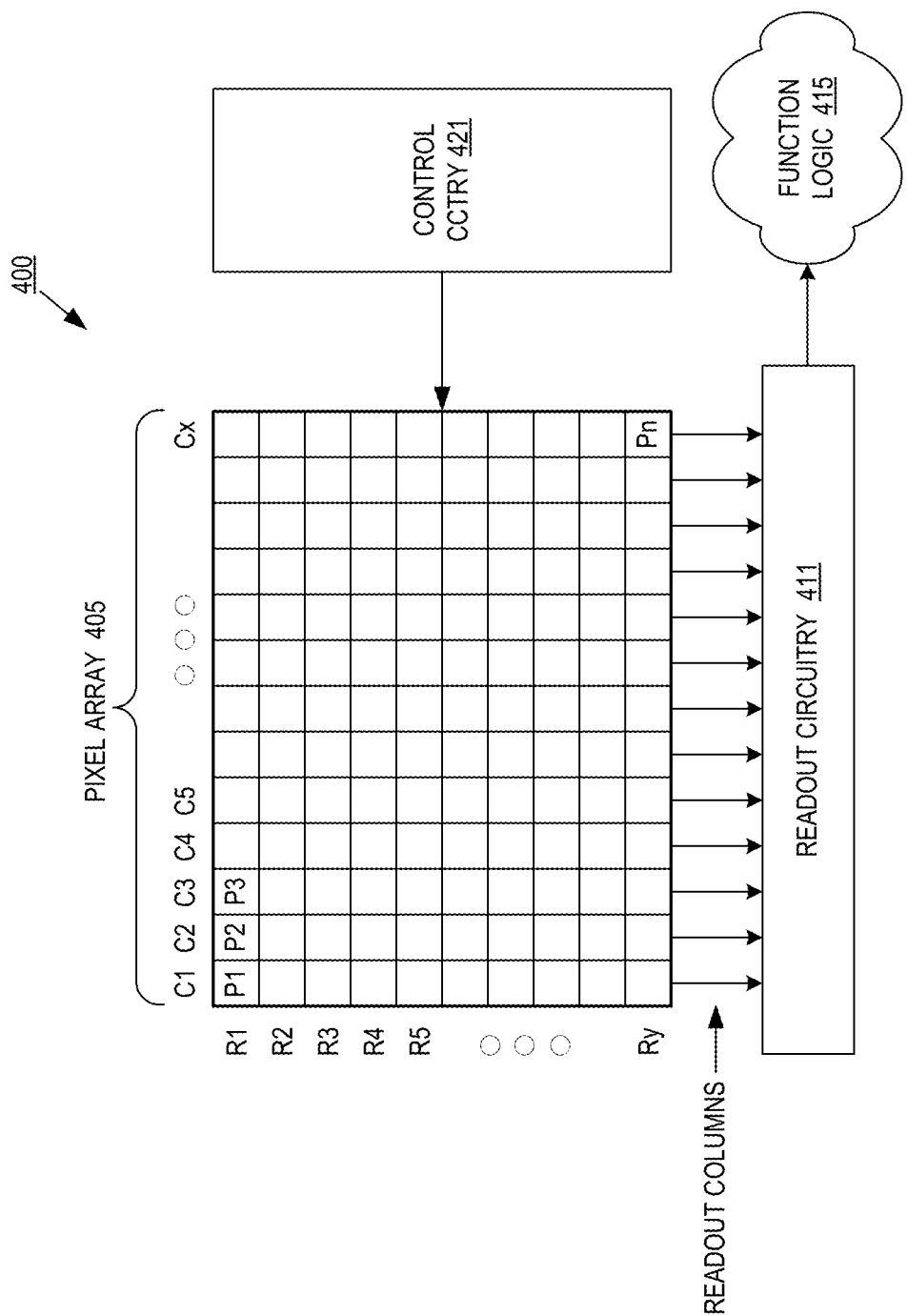
FIG. 4 illustrates an imaging system which may include the image sensor of FIG. 1, in accordance with an example of the present disclosure.

FIG. 4 illustrates an imaging system which may include the image sensor of FIG. 1, in accordance with an example of the present disclosure. Imaging system 400 includes pixel array 405, control circuitry 421, readout circuitry 411, and function logic 415. In one example, pixel array 405 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, the rows and columns do not necessarily have to be linear and may take other shapes depending on use case.

In one example, after each image sensor photodiode/pixel in pixel array 405 has acquired its image data or image charge, the image data is readout by readout circuitry 411 and then transferred to function logic 415. Readout circuitry 411 may be coupled to readout image data from the plurality of photodiodes in pixel array 405. In various examples, readout circuitry 411 may include amplification circuitry, analog-to-digital (ADC) conversion circuitry, or otherwise. Function logic 415 may simply store the image data or even alter/manipulate the image data by applying post image effects (e.g., crop, rotate, remove red eye, adjust brightness, adjust contrast, or otherwise). In one example, readout circuitry 411 may readout a row of image data at a time along readout column lines (illustrated) or may readout the image data using a variety of other techniques (not illustrated), such as a serial readout or a full parallel readout of all pixels simultaneously.

In one example, control circuitry 421 is coupled to pixel array 405 to control operation of the plurality of photodiodes in pixel array 405. Control circuitry 421 may be configured to control operation of the pixel array 405. For example, control circuitry 421 may generate a shutter signal for controlling image acquisition. In one example, the shutter signal is a global shutter signal for simultaneously enabling all pixels within pixel array 405 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 400 may be included in a digital camera, cell phone, laptop computer, or the like. Additionally, imaging system 400 may be coupled to other pieces of hardware such as a processor, memory elements, output (USB port, wireless transmitter, HDMI port, etc.), lighting/flash, electrical input (keyboard, touch display, track pad, mouse, microphone, etc.), and/or display. Other pieces of hardware/software may deliver instructions to imaging system 400, extract image data from imaging system 400, or manipulate image data supplied by imaging system 400.

Figure 5:
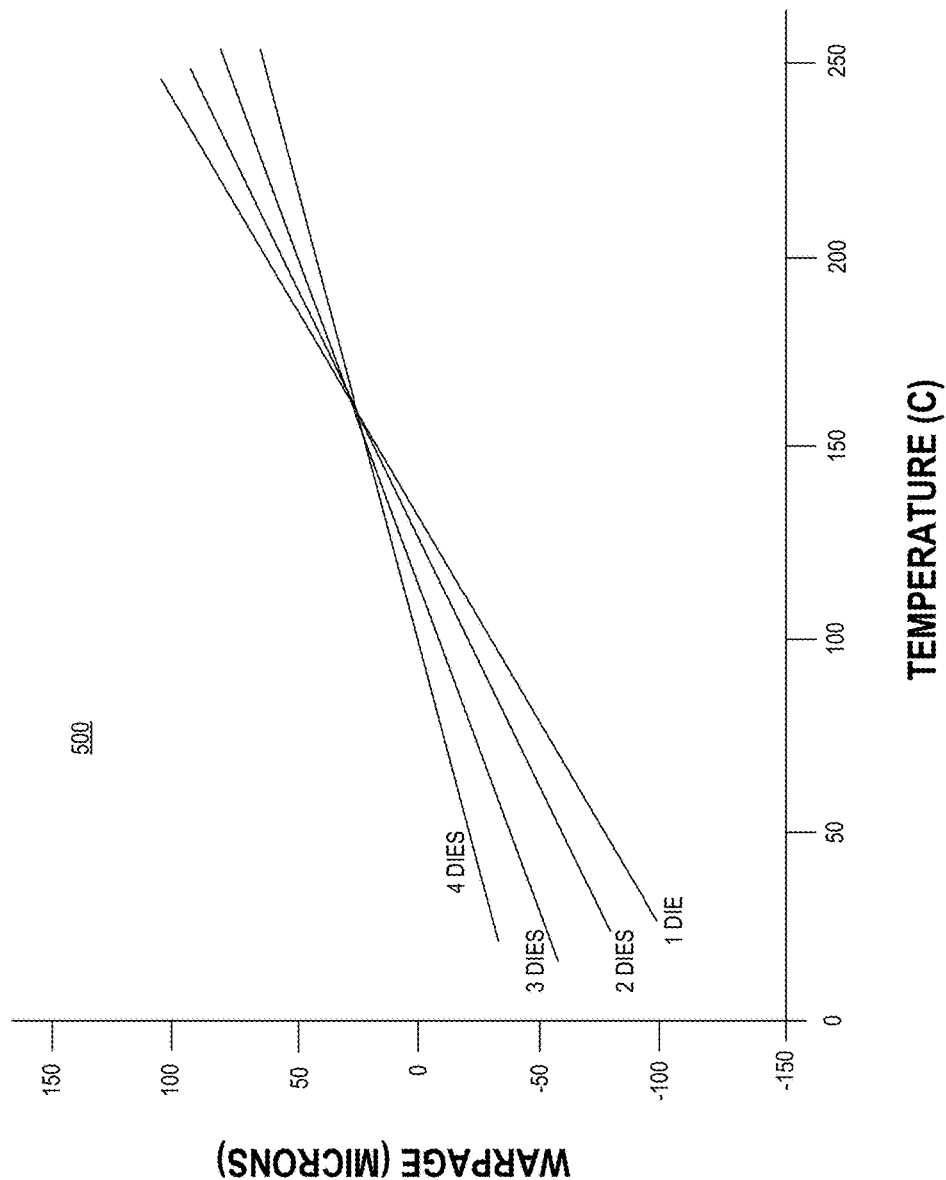
FIG. 5 illustrates a graph of substrate curvature via temperature, in accordance with an example of the present disclosure.

FIG. 5 illustrates a graph 500 of substrate curvature via temperature, in accordance with the teachings of the present disclosure. It is appreciated that graph 500 is merely an example illustration of how temperature (and number of dies) effects die warpage (bending). As shown, with increased temperate there is increased positive warpage. One of skill in the art having the benefit of the present disclosure will appreciate that a natural substrate may warp by ~70 µm, and that the thermal process (using the thermal plastic substrate) disclosed herein can cause 0.5 mm warpage. Thus, the techniques provided allow for easy manipulation of semiconductor curvature. Thus a curved image sensor may be achieved without many additional processing steps.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a plurality of photodiodes arranged in an array and disposed in a semiconductor material to receive light through a first surface of the semiconductor material, wherein at least part of the semiconductor material is curved forming a curved portion of the semiconductor material that is surrounded by a flat portion of the semiconductor material;
   a carrier wafer attached to a second surface, opposite the first surface, of the semiconductor material; and
   a polymer layer attached to the carrier wafer and spanning a width of the array so that the carrier wafer is disposed between the polymer layer and the semiconductor material, and wherein an inner surface and an outer surface of the polymer layer, which span the width of the array, are each curved.

2. The image sensor of claim 1, wherein a surface of the carrier wafer is curved.

3. The image sensor of claim 1, further comprising a color filter layer disposed proximate to the first surface of the semiconductor material so that the semiconductor material is disposed between the color filter layer and the carrier wafer.

4. The image sensor of claim 3, further comprising an optical grid layer disposed between the semiconductor material and the color filter layer to direct light into the plurality of photodiodes.

5. The image sensor of claim 4, further comprising a microlens layer positioned to direct light into the color filter layer, and wherein the color filter layer is disposed between the optical grid layer and the microlens layer.

6. The image sensor of claim 5, wherein a surface of each of the microlens layer, the optical grid layer, and the color filter layer are curved.

7. The image sensor of claim 1, wherein the polymer layer includes a thermoplastic, and wherein the image sensor is a backside illuminated image sensor.

8. The image sensor of claim 1, wherein the carrier wafer and the semiconductor material have a combined thickness of 5 μm-20 μm.

9. The image sensor of claim 1, wherein a vertex of the semiconductor material is located at a center of the array of the plurality of photodiodes.

10. The image sensor of claim 6, further comprising a lens positioned to focus light into the semiconductor material, wherein a curvature of the semiconductor material is substantially the same as a surface of the lens.

11. The image sensor of claim 1, wherein the semiconductor material, the carrier wafer, and the polymer form a material stack bonded to a mold with a curved surface region that deforms at least a portion of the material stack to the curved surface region.

12. The image sensor of claim 11, wherein the mold includes a plurality of curved surface regions, including the curved surface region, and wherein each of the plurality of curved surface regions are separated from one another by flat portions of the mold such that each of the semiconductor material, the carrier wafer, and the polymer layer have corresponding flat portions surrounding curved portions of the semiconductor material, the carrier wafer, and the polymer layer.

13. The image sensor of claim 1, wherein the carrier wafer and the polymer layer each include a respective flat portion that respectively surrounds curved portions of the carrier wafer and the polymer layer.

14. The image sensor of claim 1, wherein the polymer layer has a glass transition temperature between 160-240° C.

15. The image sensor of claim 1, wherein the polymer has a material composition including at least one of poly(methyl methacrylate) or polycarbonate.

16. The image sensor of claim 1, wherein the semiconductor material, the carrier wafer, and the polymer layer are permanently deformed with a degree of curvature based, at least in part, on exposure temperature.

* * * * *